(12) United States Patent
Vaccani

(10) Patent No.: US 8,159,244 B2
(45) Date of Patent: Apr. 17, 2012

(54) METHOD AND SYSTEM FOR TESTING A SEMICONDUCTOR PACKAGE

(75) Inventor: Jean-Francois Vaccani, Roquefort-les-Pins (FR)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 12/276,496

(22) Filed: Nov. 24, 2008

(65) Prior Publication Data

US 2009/0121735 A1 May 14, 2009

(30) Foreign Application Priority Data

Jun. 6, 2008 (EP) .................................... 08157780

(51) Int. Cl.
*G01R 31/20* (2006.01)
(52) U.S. Cl. ......... 324/754.01; 324/754.03; 324/754.07; 324/754.14
(58) Field of Classification Search .......... 324/754–765, 324/158.1, 754.08, 753.08, 754.01, 754.14; 702/117, 79
See application file for complete search history.

(56) References Cited

U.S. PATENT DOCUMENTS

| | | | |
|---|---|---|---|
| 4,056,773 A | 11/1977 | Sullivan | |
| 5,150,041 A * | 9/1992 | Eastin et al. | 324/758 |
| 5,818,248 A * | 10/1998 | St. Onge | 324/761 |
| 6,147,505 A * | 11/2000 | Ott et al. | 324/754 |
| 6,411,079 B1 * | 6/2002 | Nishikawa | 324/158.1 |
| 6,462,556 B2 * | 10/2002 | Yamashita et al. | 324/537 |
| 6,774,662 B2 * | 8/2004 | Co et al. | 324/765 |
| 6,791,344 B2 * | 9/2004 | Cook et al. | 324/754 |
| 6,825,052 B2 * | 11/2004 | Eldridge et al. | 438/15 |
| 6,903,360 B2 * | 6/2005 | McAuliffe | 250/559.4 |
| 7,102,372 B2 * | 9/2006 | Kuo | 324/754.03 |
| 7,196,294 B2 * | 3/2007 | Hofmeister et al. | 219/499 |
| 7,245,139 B2 * | 7/2007 | Miller | 324/765 |
| 7,271,606 B1 * | 9/2007 | Tang et al. | 324/761 |
| 7,400,135 B1 * | 7/2008 | Bartholomew et al. | 324/158.1 |
| 7,495,464 B2 * | 2/2009 | Miyazaki et al. | 324/756.02 |
| 7,557,596 B2 * | 7/2009 | Eldridge et al. | 324/763 |
| 7,598,756 B2 * | 10/2009 | Inoue et al. | 324/754.03 |
| 2006/0125496 A1 * | 6/2006 | Jacobsen et al. | 324/754 |
| 2006/0250149 A1 * | 11/2006 | Lan | 324/754 |
| 2007/0173097 A1 | 7/2007 | Kim | |
| 2008/0054910 A1 | 3/2008 | Lee | |
| 2008/0094086 A1 | 4/2008 | Kim | |

FOREIGN PATENT DOCUMENTS

EP 0492806 A 7/1992

* cited by examiner

*Primary Examiner* — Richard Isla Rodas
(74) *Attorney, Agent, or Firm* — Yingsheng Tung; Wade J. Brady, III; Frederick J. Telecky, Jr.

(57) ABSTRACT

A method and system for testing a semiconductor package. At least some of the illustrative embodiments are methods comprising testing a semiconductor package unit (150, 420) by electrically coupling a top printed circuit board (208, 420) to a top-side of a semiconductor package unit (150, 420), the coupling using electrically conductive top-side pogo pins (201A, 420), and a pair of adjacent top-side pogo pins (201A, 420) bridged using an electrically conductive path (302, 420), electrically coupling a bottom printed circuit board (210, 430) to a bottom-side of the semiconductor package unit (150, 430), the coupling using electrically conductive bottom-side pogo pins (201B, 430), said top-side pogo pins (201A, 430) and said bottom-side pogo pins are of substantially equal height (201B, 430), and transmitting test signals from the bottom printed circuit board to the semiconductor device package by way of the bottom-side pogo pins (210, 440).

13 Claims, 4 Drawing Sheets

METHOD AND SYSTEM FOR TESTING A SEMICONDUCTOR PACKAGE

BACKGROUND OF THE INVENTION

Electronic devices are continually getting smaller, faster, and using less power, while simultaneously being able to support and perform a greater number of increasingly complex and sophisticated functions. One reason for these trends is an ever increasing demand for small, portable and multi-functional electronic devices. For example, cellular phones, personal computing devices, and personal audio devices (e.g., MP3 players) are in great demand in the consumer market. Such electronic devices rely on a limited power source (e.g., batteries) while providing ever-increasing processing capabilities and storage capacity.

Accordingly, there is a trend in the semiconductor industry to manufacture package-on-package semiconductor devices. A package-on-package semiconductor device involves stacking two or more semiconductor packages on top of each other. For example, a package-on-package semiconductor device may involve stacking a memory device (e.g. flash memory, SDRAM, etc.) on top of a memory controller. Package-on-package semiconductor devices keep the cost of manufacturing lower and provide higher yield.

SUMMARY OF THE INVENTION

At least some of the illustrative embodiments are methods comprising testing a semiconductor package unit by electrically coupling a top printed circuit board to a top-side of a semiconductor package unit, the coupling using electrically conductive top-side pogo pins, a pair of adjacent top-side pogo pins bridged using an electrically conductive path, electrically coupling a bottom printed circuit board to a bottom-side of the semiconductor package unit, the coupling using electrically conductive bottom-side pogo pins, said top-side pogo pins and said bottom-side pogo pins are of substantially equal height, and transmitting test signals from the bottom printed circuit board to the semiconductor device package by way of the bottom-side pogo pins.

Other illustrative embodiments are systems for testing a semiconductor package unit comprising a top printed circuit board comprising a plurality of barrels, each of the plurality of barrels comprises an electrically conductive pogo pin having a particular length, and each pogo pin configured to electrically couple to a top-side connector on a semiconductor package unit, and electrically conductive paths configured to bridge a pair adjacent barrels, a bottom printed circuit board comprising plurality of barrels, each of the plurality of barrels comprises an electrically conductive pogo pin having substantially the particular length, each pogo pin configured to electrically couple to a bottom-side connector on the semiconductor package unit, and said bottom printed circuit board configured to transmit test signals to the semiconductor package unit by way of the barrels.

Yet other illustrative embodiments are an apparatus comprising a printed circuit board configured to be disposed on a top-side of semiconductor package unit, the printed circuit board comprising a plurality of barrels, each of the plurality of barrels comprises an electrically conductive pogo pin, and each pogo pin configured to electrically couple to a top-side connector on a semiconductor package unit; said each pogo pin is of substantially equal height, and electrically conductive paths configured to couple a pair adjacent barrels; and said printed circuit board is configured to enable a test of the semiconductor package unit.

BRIEF DESCRIPTION OF THE DRAWINGS

For a more detailed description of the various embodiments, reference will now be made to the accompanying drawings, wherein.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

Unless otherwise stated, the term "semiconductor package unit" means a device having contact points on the top-side and the bottom-side of the device.

DETAILED DESCRIPTION

The following discussion is directed to various embodiments. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
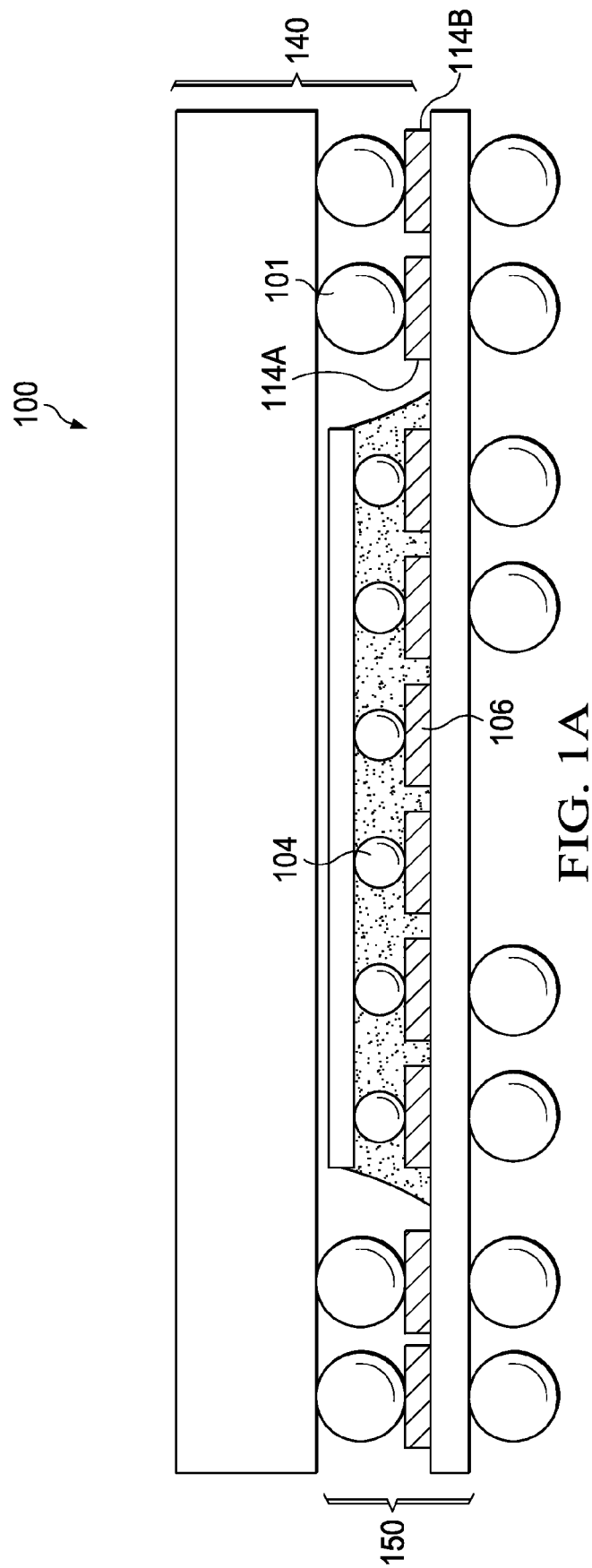
FIG. 1A shows a package-on-package semiconductor device.
Figure 1B:
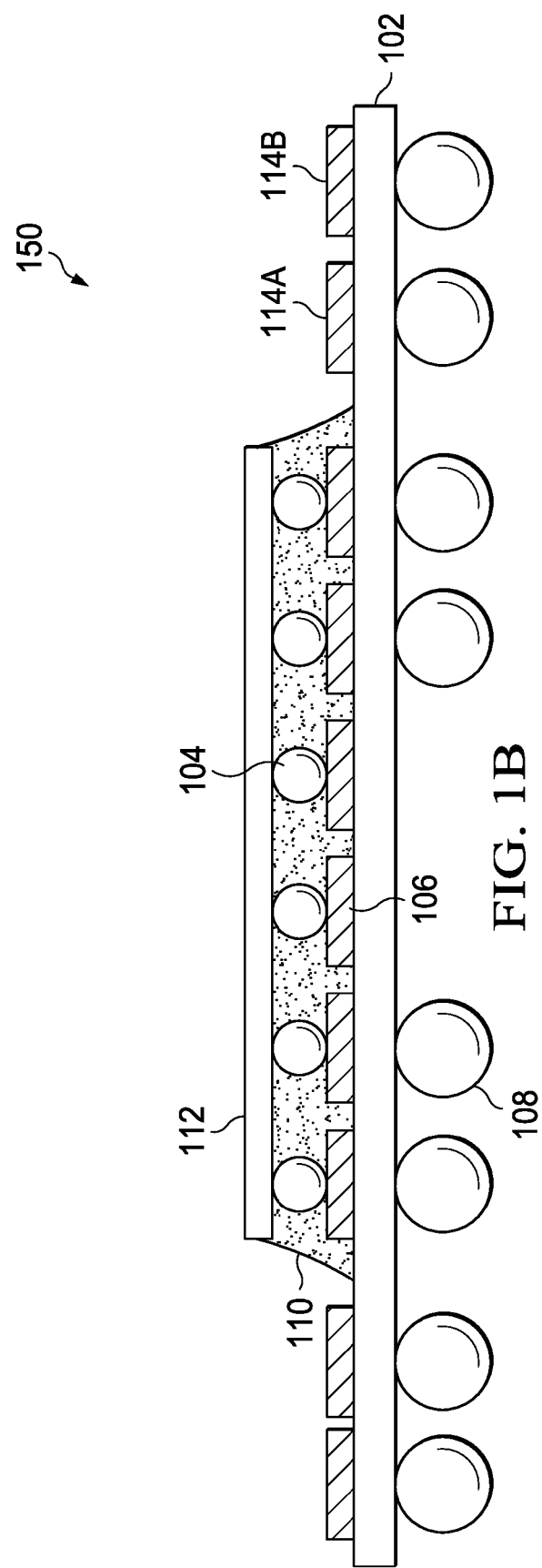
FIG. 1B shows a bottom semiconductor package unit of the package-on-package semiconductor device.

The various embodiments are directed to methods and related systems for testing a bottom semiconductor package unit of a package-on-package semiconductor device. FIG. 1A illustrates a cross sectional view of the package-on-package semiconductor device 100. In particular, FIG. 1A illustrates a top semiconductor package unit 140 (e.g., flip chip memory device) stacked on top of a bottom semiconductor package unit 150 (e.g., memory controller). The top semiconductor package unit 140 is electrically coupled to the bottom semiconductor unit 150 by way of bumps 101 and top-side connector pads 114A-114B. FIG. 1B illustrates the cross sectional view of the bottom semiconductor package unit 150 as a flip chip assembly coupled to a substrate 102 (e.g., a printed circuit board, or a semiconductor tape). The bottom semiconductor package unit 150 electrically couples to the substrate 102 by way of the bumps 104 (e.g., solder bumps, gold stud bumps). The bumps 104 provide an electrically conducting path between an integrated circuit die 112 and conducting pads 106 on the substrate 102. A non-conductive underfill adhesive 110 fills the portion between the integrated circuit die 112 and the substrate 102, the underfill adhesive 110 attaches, at least in part, the flip chip integrated circuit die 112 to the substrate 102. External bumps 108 connect the bottom semiconductor package unit 150 to a system level printed circuit board (not shown in FIG. 1). As previously discussed, the top semiconductor package unit 140 is electrically coupled to the bottom semiconductor package unit 150 by way of top-side connector pads 114A-114B. In at least some embodiments, the top-side connector pad 114A provides an output from the bottom semiconductor package unit 150 to top semiconductor package unit, and the top-side connector pad 114B provides an input into the bottom semiconductor package unit 150 from the top semiconductor package unit. In other embodiments, the top-side connector pad 114A provides the input while the top-side connector pad 114B provides the output.

Figure 2:
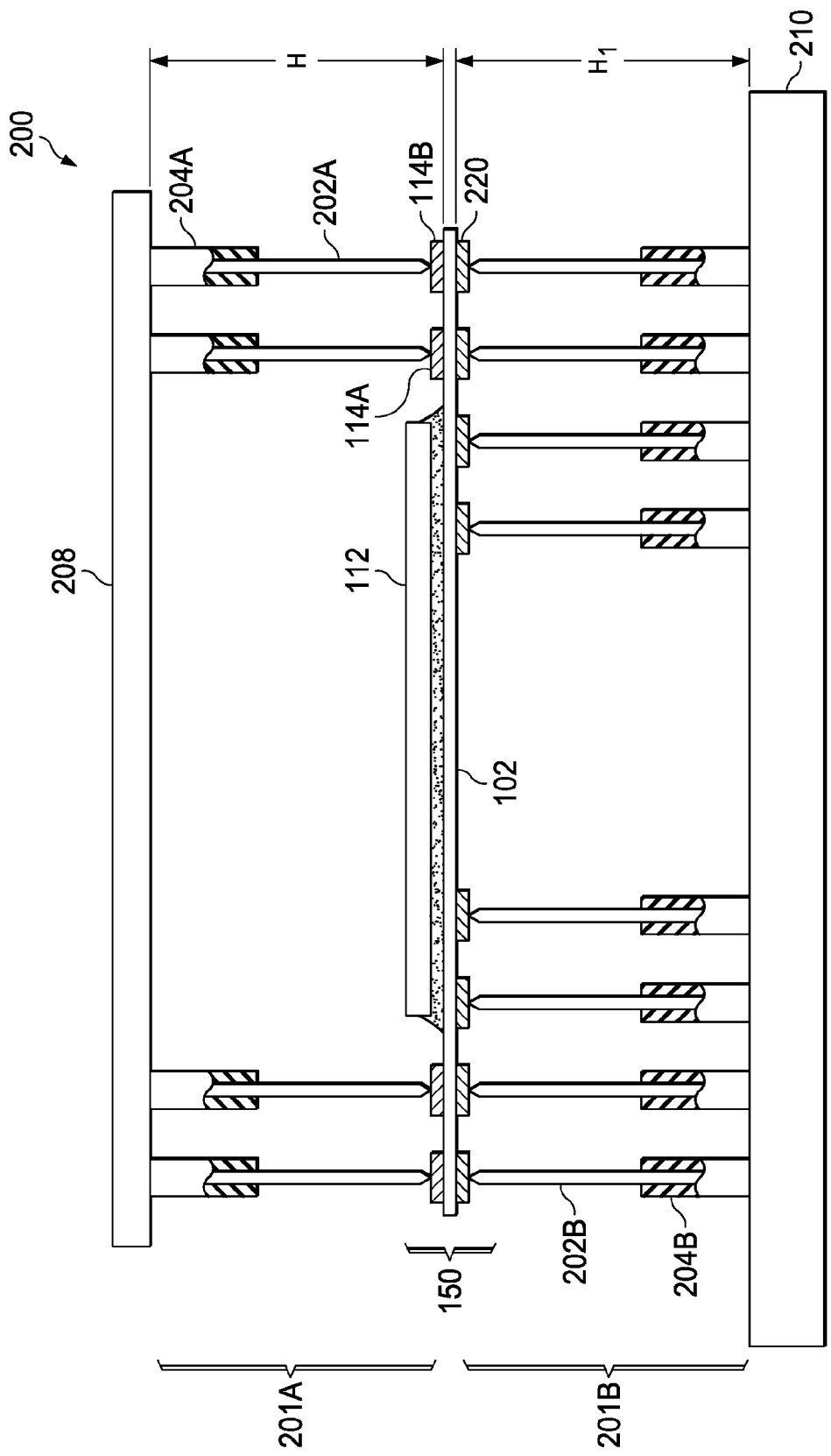
FIG. 2 shows a testing system in accordance with some embodiments.

FIG. 2 illustrates a cross sectional view of a testing system 200 for testing the bottom semiconductor package unit 150. The testing system 200, as illustrated in FIG. 2, comprises a top printed circuit board 208 positioned above and parallel to the bottom semiconductor package unit 150, and a bottom printed circuit board 210 positioned below and parallel to the bottom semiconductor package unit 150. A plurality of top-side pogo pins 201A electrically couple the top printed circuit board 208 to the top-side connector pads 114A-114B of the bottom semiconductor package unit 150. Each of the top-side pogo pins 201A comprises an elongated barrel 202A and a probe pin 204A. The barrels 202A are spring loaded enabling the probe pins 204A to longitudinally compress against the top-side connector pads 114A-114B. Collectively, the barrels 202A and the probe pins 204A form an electrically conductive path from the top printed circuit board 208 to the top-side connector pads 114A-114B of the bottom semiconductor package unit 150. A plurality of bottom-side pogo pins 201B electrically couple the bottom printed circuit board 210 to the bottom-side connector pads 220 below the bottom semiconductor package unit 150. Each of the bottom-side pogo pins 201B comprises an elongated barrel 202B and a probe pin 204B. The barrels 202B are spring loaded enabling the probe pins 204B to longitudinally compress against the bottom-side connector pads 220. Collectively, the barrels 202B and the probe pins 204B form an electrically conductive path from the bottom printed circuit board 210 to the bottom-side connector pads 220 below the bottom semiconductor package unit 150. In alternative embodiments, a plurality of bottom-side pogo pins 201B electrically couple the bottom printed circuit board 210 to the external bumps 108 below the bottom semiconductor package unit 150. In at least some embodiments, the top-side pogo pins 201A and the bottom-side pogo pins 201B are of substantially equal height "h".

Figure 3:
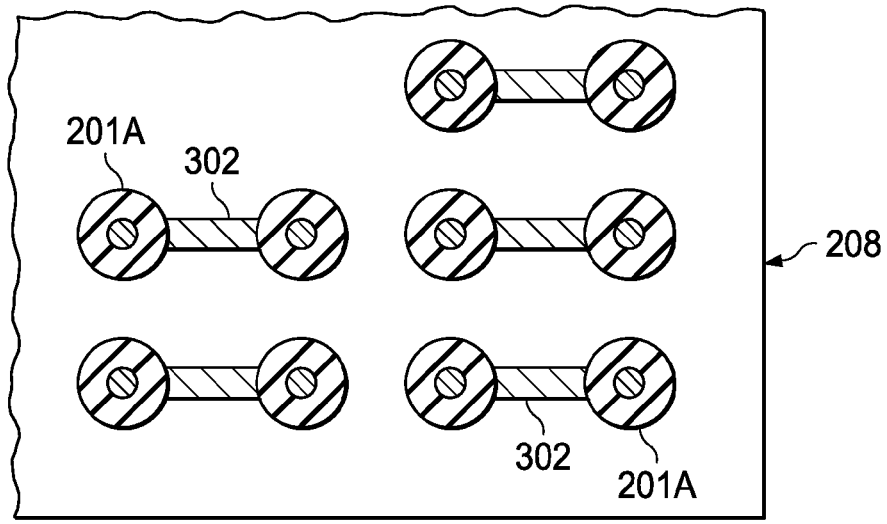
FIG. 3 shows a top view of the top printed circuit board.

In at least some embodiments, a pair of adjacent top-side pogo pins 204A are electrically bridged together on the top printed circuit board 208. FIG. 3 illustrates a top view of a portion of the top printed circuit board 208. In accordance with FIG. 3, the pogo pins 201A are electrically coupled using electrically conductive path 302. In at least some embodiments, the electrically conductive path 302 is etched in the top printed circuit board 208. Consequently, the electrically conductive path 302 bridges a top-side pogo pin 201A with the adjacent top-side pogo pin 201A. As will be thoroughly discussed below, one of the bridged top-side pogo pins 201A receives a signal outputted from the bottom semiconductor package 150, the signal is routed through the electrically conductive path 302 and the signal is inputted to the bottom semiconductor package 150 by way of the adjacent top-side pogo pin 201A.

The testing system 200 as illustrated in the FIG. 2 and FIG. 3 performs continuity tests and functional tests of the bottom semiconductor package unit 150. The bottom printed circuit board 210 transmits electrical test signals to the bottom semiconductor package unit 150 by way of the electrically conductive path created by the bottom-side pogo pins 201B. In at least some embodiments, the test signal is generated by a signal generator, not shown in FIG. 2, coupled to the bottom printed circuit board 210. The test signal is outputted by the bottom semiconductor package unit 150, and routed through the top-side connector pad 114A, and pogo pin 201A. Additionally, the test signal is routed through the electrically conductive path 302, pogo pin 201A, and inputted into the bottom semiconductor package unit 150 through the top-side connector pad 114B.

In at least some embodiments, the testing system 200 performs the continuity tests by transmitting a test signal (e.g. a sequence of bits) from the bottom printed circuit board 210 to the bottom semiconductor package unit 150. Consider, for purpose of explanation, that the bottom semiconductor package unit 150 is a memory controller to be stacked below a memory device (e.g., flash memory, SDRAM, DDR) in the package-on-package semiconductor device. The continuity test for the memory controller comprises writing test data to an address in the memory device. The bottom printed circuit board 210 transmits a test signal with write test data that causes the bottom semiconductor package unit 150 (i.e., the memory controller) to write test data to an address in the top semiconductor package unit 140 (i.e., the memory device). The test signal is routed through the bottom semiconductor package unit 150, and the bottom semiconductor package unit 150 outputs the write test data from the top-side connector 114A. The write test data is routed through the top-side pogo pin 201A, through the electrical path 302, through the top-side pogo pin 201A, and supplied again into the bottom semiconductor package unit 150 by the top-side connector pad 114B. The write test data is received by the bottom printed circuit board 210 through the bottom-side pogo pins 201B, and the bottom printed circuit board 210 compares the received write test data with the transmitted write test data. If the received write test data is different from the transmitted test data then the bottom semiconductor package unit 150 is determined to have failed the continuity test. Similarly, if the received write test data is same as the transmitted write test data then the semiconductor package unit 100 is determined to have passed the continuity test.

In at least some related art, the testing systems are not enabled to perform functional tests of the semiconductor package unit because the testing systems comprise pogo pins of various lengths. For example, there may be pogo pins that electrically couple the top printed circuit board directly to the bottom printed circuit board. The top printed circuit board as illustrated in FIG. 3 enables the testing system as illustrated in FIG. 2 to comprise pogo pins of substantially the same length "h". Thus, the testing system as illustrated in FIGS. 2 and 3 may perform functional tests of the bottom semiconductor package unit 150. In at least some embodiments, the functional tests may be specific to the bottom semiconductor package unit 150. Consider, for purpose of explanation, that the bottom semiconductor package unit 150 is a memory controller to be stacked below a memory device (e.g., flash memory, SDRAM, DDR) in the package-on-package semiconductor device. The functional test for the memory controller comprises measuring the time to access the memory device. The testing system 200 measures access time of the memory controller by capturing at the top-side connector pad 114B a signal outputted from the top-side connector pad 114A. For example, the bottom printed circuit board 210 transmits a test signal with write test data that causes the bottom semiconductor package unit 150 (i.e., the memory controller) to write test data to an address in the top semiconductor package unit 140 (i.e., the memory device). A propagation delay is measured as the write test data outputted by the top-side connector pad 114A is routed through the top-side pogo pin 201A, through the electrically conductive path 302, and captured at the top-side connector 114B. The propagation delay from the top-side connector 114A to the top-side connector 114B is a measure of the access time of the bottom semiconductor package unit 150.

Figure 4:
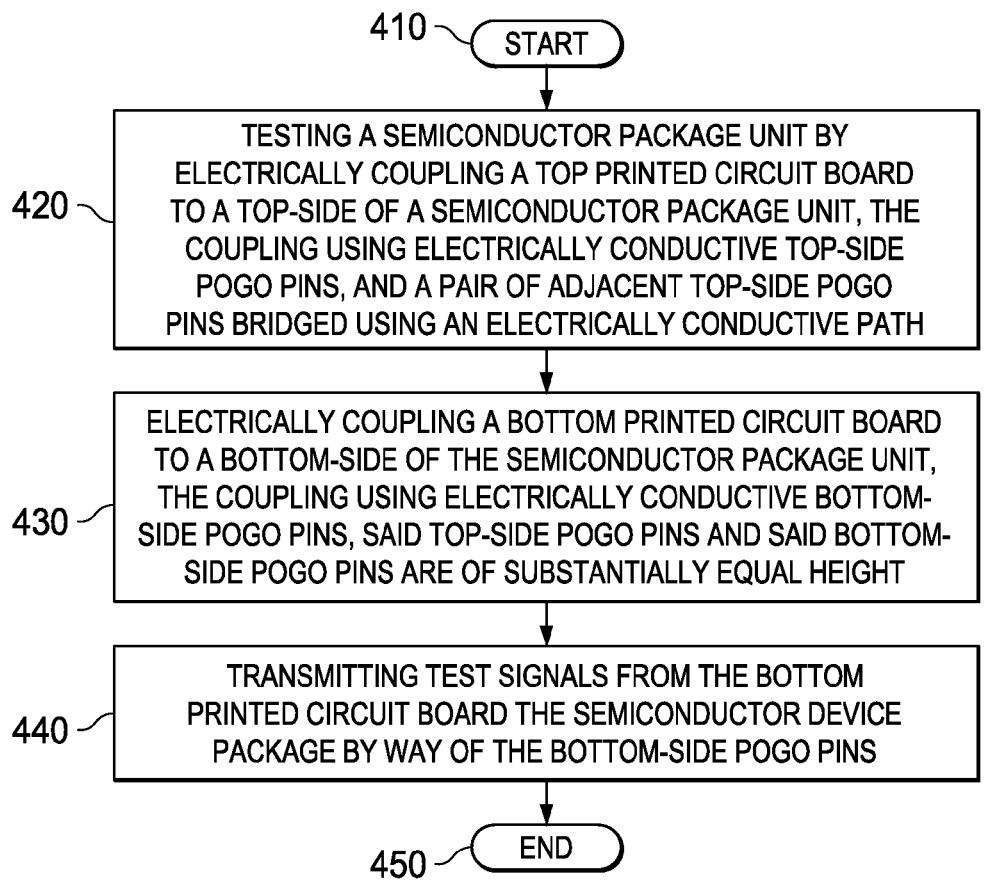
FIG. 4 shows a method in accordance with at least some embodiments.

FIG. 4 shows a method in accordance with at least some embodiments. In particular, method starts (block 410) and proceeds to testing a semiconductor package unit by electrically coupling a top printed circuit board to a top-side of a semiconductor package unit, the coupling using electrically conductive top-side pogo pins, and a pair of adjacent top-side pogo pins bridged using an electrically conductive path (block 420). In some embodiments, the top-side pogo pins are bridged by etching an electrically conductive path in the top printed circuit board. Next, a bottom printed circuit board is coupled to a bottom-side of the semiconductor package unit, the bottom printed circuit board is coupled using electrically conductive bottom-side pogo pins (block 430). In at least some embodiments, the top-side pogo pins and the bottom-side pogo pins are of substantially equal height. The bottom printed circuit board transmits test signals to the semiconductor device package by way of the bottom-side pogo pins (block 440). The method then ends (block 450).

The above discussion is meant to be illustrative of the principles and various embodiments of the present invention. Numerous variations and modifications will become apparent to those skilled in the art once the above disclosure is fully appreciated. For example, the testing of the semiconductor package unit may be performed using any other semiconductor package unit (e.g. ball grid array (BGA), pin grid array (PGA), etc.). Moreover, the various embodiments are discussed with the functional test performed for the memory controller; however, the functional test may be performed for other semiconductor device (e.g. a micro controller, a digital signal processor, etc.). Finally, the various embodiments may perform testing of additional top-side connector pads (not specifically illustrated) by utilizing the bottom printed circuit board. It is intended that the following claims be interpreted to embrace all such variations and modifications.

What is claimed is:

1. A method for testing a semiconductor package unit, comprising:
    electrically coupling a top printed circuit board to connectors on a top side of the semiconductor package unit, which has connectors on its bottom surface;
    supplying a first test signal to the semiconductor package unit at a connector on its bottom surface to perform a functional test that generates, in the semiconductor package unit, a second test signal different from the first test signal;
    transmitting the second test signal from an output pad on the top side of the semiconductor device package unit to the top printed circuit board by way of a first pogo pin of a first length disposed between the semiconductor device package unit and the top printed circuit board; and
    returning the same second test signal from the top printed circuit board to an input pad of the semiconductor device package unit by way of a second pogo pin of the first length disposed between the semiconductor device package unit and the top printed circuit board to test the semiconductor package unit.

2. The method as defined in claim 1 wherein performing the functional test further comprises measuring memory access time of the semiconductor package unit.

3. The method as defined in claim 2 wherein measuring memory access time further comprises measuring a propagation delay from a connector providing an output from the semiconductor package unit to a connector providing an input to the semiconductor package unit.

4. The method of claim 1, further comprising transmitting the first test signal to the semiconductor package unit by way of a third pogo pin connected to a connector on a bottom side of the semiconductor package unit, thereby triggering the transmitting of the second test signal from the semiconductor package unit to the first pogo pin.

5. The method of claim 4, in which the third pogo pin is affixed to a bottom printed circuit board coupled to the connectors on the bottom surface of the semiconductor package unit.

6. The method of claim 4, in which the first test signal to the semiconductor package unit includes a signal to write data into a memory device.

7. The method of claim 6, in which the second test signal transmitted from the semiconductor device package unit includes an address in a memory device.

8. The method of claim 7, in which the second test signal further includes data to be written to the address in the memory device.

9. The method of claim 1, in which the first pogo pin and the second pogo pin are electrically bridged with a conductive path in the top printed circuit board.

10. An apparatus comprising:
    a first printed circuit board disposed on a top-side of a semiconductor package unit, the first printed circuit board comprising electrically conductive paths configured to bridge a pair of adjacent pogo pins to each other;
    a plurality of pairs of pogo pins of a first length affixed to the first printed circuit board, the pogo pins in each pair electrically coupled to a conductive path on the first printed circuit board and to an input pad and an output pad on a top-side of a semiconductor package unit;
    a second printed circuit board disposed on a bottom-side of the semiconductor package unit, configured to transmit external test signals to the semiconductor package unit through connectors on the bottom-side of the semiconductor package unit in order to perform a functional test on the semiconductor package unit that generates a second test signal, and to communicate with the first printed circuit board; and
    said first printed circuit board enabling the second test signal to return to the semiconductor package unit by way of a first pogo pin of a pogo-pin pair after receiving the second test signal from the semiconductor package unit by way of a second pogo pin of the pogo-pin pair.

11. The apparatus as defined in claim 10, wherein one of the pogo pins is electrically coupled to a connector to provide an input signal to the semiconductor package and one pogo pin is electrically coupled to a connector to provide an output signal from the semiconductor package unit that is same as the input signal.

12. The apparatus as defined in claim 10, wherein the printed circuit boards configured to enable the functional test are further configured to enable a measure of memory access time of the semiconductor package unit.

13. The apparatus as defined in claim 12, wherein the printed circuit boards configured to enable the measure of memory access time are further configured to enable a measure of propagation delay from a connector configured to provide an output from the semiconductor package unit to a connector configured to provide an input to the semiconductor package unit.

* * * * *